United States Patent [19]

Lucey

[11] 4,336,311

[45] Jun. 22, 1982

[54] HUMIDITY- AND SALT-RESISTANT ELECTRONIC COMPONENT

[75] Inventor: Michael F. Lucey, North Adams, Mass.

[73] Assignee: Sprague Electric Company, North Adams, Mass.

[21] Appl. No.: 180,749

[22] Filed: Aug. 25, 1980

[51] Int. Cl.³ .............................................. B05D 3/06
[52] U.S. Cl. ............................. 428/521; 204/159.22; 427/54.1; 526/261
[58] Field of Search ................................. 427/54.1, 44; 204/159.22; 526/261, 302; 428/521

[56] References Cited

U.S. PATENT DOCUMENTS

| | | | |
|---|---|---|---|
| 2,832,755 | 4/1958 | Melamed | 526/302 |
| 3,108,987 | 10/1963 | Galli et al. | 526/261 |
| 3,300,429 | 1/1967 | Glavis et al. | 260/29.6 RW |
| 3,356,627 | 12/1967 | Scott | 260/29.6 RB |
| 3,914,463 | 10/1975 | Mercurio et al. | 427/54.1 |
| 3,990,395 | 11/1976 | Evans et al. | 118/642 |
| 4,039,905 | 8/1977 | Pearce et al. | 361/433 |
| 4,146,916 | 3/1979 | Breeden et al. | 361/433 |
| 4,180,598 | 12/1979 | Emmons | 427/54.1 |
| 4,216,134 | 8/1980 | Brenner | 526/261 |
| 4,243,788 | 1/1981 | Kuehn | 526/261 |

FOREIGN PATENT DOCUMENTS 54-19894  7/1979  Japan .

OTHER PUBLICATIONS

Peterson, E. A., et al., "Acrylated Urethane Oligomers for Radiation Curing", Radiation Curing; abstr. Mater. Speakg, Thiokol Chem. Div. publ., 4 pp.

*Primary Examiner*—John H. Newsome
*Attorney, Agent, or Firm*—Connolly and Hutz

[57] ABSTRACT

An electronic component is coated with an ultraviolet light cured composition to make it humidity and salt water resistant. The composition contains a urethane, at least one acrylate, a wet adhesion monomer, a photoinitiator, and optionally a thixotropic agent.

12 Claims, 1 Drawing Figure

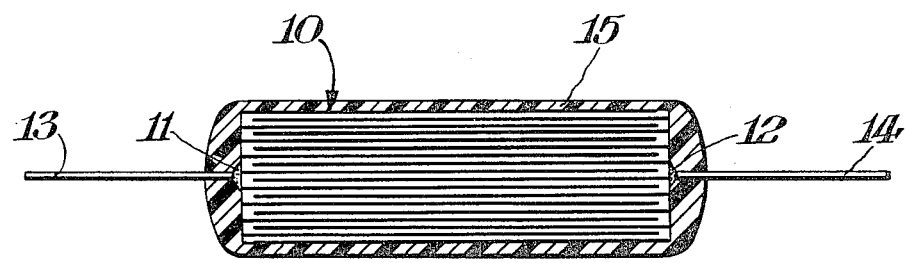

HUMIDITY- AND SALT-RESISTANT ELECTRONIC COMPONENT

BACKGROUND OF THE INVENTION

This invention relates to an electronic component coated with an ultraviolet radiation-curable coating that is humidity- and salt-water resistant.

Electronic components are being used in environments where they have not been used before. Components used in elecronic ignition systems must withstand not only elevated temperatures from automotive engines but also thermal shock from salt water sprays. Salt water spray from roads that have been salted to melt ice is particularly hard on these components. Exposure to sub-zero ambient temperatures is not uncommon.

Coatings are needed to protect the components from these environments. At the same time, manufacturers are looking for means to reduce their energy usage. Ultraviolet-curable systems are being studied as a solution to these problems.

SUMMARY OF THE INVENTION

An electronic component is rendered resistant to humidity, salt water, alkaline materials, and thermal shock by providing it with an ultraviolet radiation curable urethane-acrylate coating.

The coating is prepared by blending a urethane, preferably an aliphatic acrylic urethane, with at least one acrylate, a photoinitiator, a wet-adhesion monomer, and, optionally, a thixotropic agent. The coating is applied by dipping, spraying, painting, or roll-coating. Depending on the application method, the amount of acrylate or thixotropic agent is increased or decreased.

The urethane is preferably an aliphatic urethane and particularly an acrylic aliphatic urethane as these provided compositions with the best adhesion between layers when more than one coat was used on the electronic components.

At least one acrylate, preferably a triacrylate, must be present. Since the commercially available triacrylates actually contain a relatively large amount of tetraacrylate, e.g. the preferred pentaerythritol triacrylate analyzed 46 wt% triacrylate, 8 wt% diacrylate, and 46 wt% tetraacrylate, the triacrylate should be called a triacrylate-tetraacrylate blend. A mono- and/or diacrylate may be used together with the triacrylate-tetraacrylate blend. The choice is influenced by the component to be covered and just how flexible the final coating needs to be.

When a leaded unit whose leads will be flexed or bent is to be coated, a monoacrylate will make up a significant part of the acrylate part of the composition. Diacrylates provide greater humidity and salt-resistance. If flexure is not a particular concern, then the diacrylate is used preferably. The particular component to be coated, the application method to be used, and the end use of the product all affect the composition of the coating. For example, a wound unit may be coated by painting, spraying, or roll-coating, while a pellet is generally dipped.

The wet adhesion monomer aids adhesion between coats as well as to the electronic component. However, the ones tried have had a detrimental effect on humidity resistance at concentrations above 3 wt%.

The wet adhesion monomer also appears to interact with the triacrylate-tetraacrylate blend of the coating composition as there is a noticeable exotherm about two seconds after the uv-cure has taken place. This exotherm does not apparently occur in the absence of either the monomer or the triacrylate-tetraacrylate blend. Since it does not occur, no thermal initiator need be used, and 1-inch thick cured coatings can be obtained in one application. Also, the coating will cure under end caps where uv-light does not penetrate.

Reactive wet adhesion monomers that have proved satisfactory have been allylic or acrylic ureides or cyanurates, such as are available from American Cyanamid Company, Industrial Chemicals Division, Wayne, N.J. or from Alcolac, Inc., 3440 Fairfield Rd., Baltimore, MD.

BRIEF DESCRIPTION OF THE FIGURE

The sole FIGURE is a cross-section of a wound metallized film capacitor bearing the salt- and humidity-resistant coating of the present invention.

DESCRIPTION OF THE PREFERRED EMBODIMENTS

The following examples illustrate the humidity-saltwater resistance of metallized Mylar film capacitors. Metallized Mylar was chosen for testing because it is the most difficult to coat. If a coating will adhere to it and pass humidity and salt tests, the coating will adhere to other film., e.g., metallized polypropylene, and film-foil capacitors.

A thixotrope was added to the coating formulation to make it less flowable. However, with other types of applications such as by spraying, no thixotropic agent is needed; smaller amounts are usually needed when applying the formulation by roll-coating. The formulation may also contain pigment materials.

Referring to the FIGURE, a metaled Mylar capacitor 10 with axial leads 13 and 14 attached to the sprayed ends by solder 11, 12 is coated with the composition 15 (detailed below) which is then cured by exposure to ultraviolet light. Other units, such as tantalum pellets, stacked film, film-foil, and extended foil, with and without end caps, may be similarly coated.

The examples below give humidity or salt- and humidity test results. To pass the humidity test, the capacitance of metallized Mylar capacitors must not change by ± 10%. The salt test involves heat soaking the units at 100° C. for 1 hr. and then immediately immersing them in a 10% sodium chloride solution at 25° C. for 15 min.

EXAMPLE 1

A metallized Mylar capacitor 10 was coated with a composition 15 containing 66.8 wt% aliphatic acrylic urethane, 24.0 wt% ethoxyethoxyethyl acrylate, 4.8 wt% pentaerythritol triacrylate-tetraacrylate blend, 1.2 wt% photoinitiator, 2.0 wt% fumed silica thixotrope, and 1.2 wt% wet adhesion monomer. The composition was cured by exposure to 1300W ultraviolet lamps for up to 11.5 sec. The coated capacitors were subjected to the salt test and then a standard humidity test at 75° C. for 72 hrs. The Table below gives initial electrical properties, the same properties after the salt test, and after the salt and humidity tests. Capacitance is in microfarads; IR is measured in megamicrofarads, and DF stands for dissipation factor. The average for 20 capacitors is given.

TABLE 1

| | Capacitance | DF | IR | % Δ Cap. |
|---|---|---|---|---|
| Initial | 0.3461 | 0.52 | 92982 | — |
| After Salt | 0.3471 | 0.51 | 95241 | +0.280 |
| After Salt & Humidity | 0.3706 | 0.62 | 11118 | +7.103 |

The changes in electrical properties are well within normal tolerance limits. Similar coatings containing 50 to 70 wt% acrylic urethane, 0 to 33 wt% monoacrylate, 5 to 8 wt% triacrylate-tetraacrylate blend, 1 wt% wet adhesion monomer, 1 wt% photoinitiator, and 2 wt% thixotrope proved satisfactory.

EXAMPLE 2

A series of metallized Mylar wound capacitors were painted with the following compositions. Upon curing under 1300W ultraviolet lamps for up to 11.5 sec., a tough coating was obtained. Amounts are in weight-percent.

TABLE 2a

| Material | A | B | C | D |
|---|---|---|---|---|
| Aliphatic acrylic urethane | 50.0 | 60.0 | 70.0 | 50.0 |
| Pentaerythritol triacrylate-tetraacrylate blend | 6.0 | 20.0 | 10.0 | 40.0 |
| Tetraethylene glycol diacrylate | 40.0 | 16.5 | 16.5 | 4.0 |
| Wet adhesion monomer | 1.0 | 0.5 | 0.5 | 3.0 |
| Photoinitiator | 1.0 | 1.0 | 1.0 | 1.0 |
| Thixotropic Agent | 2.0 | 2.0 | 2.0 | 2.0 |

The same electrical properties were measured as described in Example 1. Results for the humidity test are given below for the average of 20 capacitors.

TABLE 2b

| Lot | | Capacitance | DF | IR | % Δ Cap. |
|---|---|---|---|---|---|
| A. | Initial | 0.3521 | 0.49 | 88025 | — |
| | After Humidity | 0.3726 | 0.70 | 10162 | +5.817 |
| B. | Initial | 0.3538 | 0.49 | 86059 | — |
| | After Humidity | 0.3726 | 0.54 | 15105 | +5.719 |
| C. | Initial | 0.3518 | 0.48 | 88195 | — |
| | After Humidity | 0.3724 | 0.63 | 20190 | +5.866 |
| D. | Initial | 0.3546 | 0.43 | 86254 | — |
| | After Humidity | 0.3747 | 0.58 | 24437 | +5.520 |

EXAMPLE 3

A second group of capacitors from lot C was subjected to the salt test followed by five cycles of temperature cycling from −55° C. to +125° C., and then another salt test to check for cracks not visible microscopically. The same electrical properties were measured as above. There were 19 capacitors in the sample

TABLE 3

| | Capacitance | DF | IR | % Δ Cap. |
|---|---|---|---|---|
| Initial | 0.3537 | 0.50 | 806035 | — |
| After Salt | 0.3531 | 0.46 | 132413 | −0.245 |
| After Temp. Cycle | 0.3531 | 0.46 | 132413 | 0.000 |
| After 2nd Salt | 0.3529 | 0.47 | 138091 | −0.041 |

EXAMPLE 4

Another group of 15 capacitors from lot C was tested for resistance to Loncoterge, an alkaline material used to wash circuit boards. The parts were heated to 100° C. and then immersed in the alkaline Loncoterge solution at 60° C. The units were then subjected to the salt test and temperature cycling The same electrical properties as above were measured.

TABLE 4

| | Capacitance | DF | IR | % Δ Cap. |
|---|---|---|---|---|
| Initial | 0.3573 | 0.48 | 114846 | — |
| After Loncoterge | 0.3572 | 0.46 | 133950 | −0.037 |
| After Salt | 0.3572 | 0.46 | 133950 | 0.000 |
| After Temp. Cycle | 0.3580 | 0.42 | 115071 | +0.233 |

EXAMPLE 5

Another group of capacitors was painted with a composition consisting of 60 wt% aliphatic acrylic urethane, 30 wt% pentaerythritol triacrylate-tetraacrylate blend, 6.5 wt% tetraethylene glycol diacrylate, 0.5 wt% wet adhesion monomer, 1 wt% photoinitiator, and 2 wt% thixotropic agent. The coating was cured by exposure to 1300 W ultraviolet lamps and subjected to the humidity test. The results are given below.

TABLE 5

| | Capacitance | DF | IR | % Δ Cap. |
|---|---|---|---|---|
| Initial | 0.3521 | 0.47 | 88025 | — |
| After Humidity | 0.3708 | 0.57 | 30065 | +5.319 |

It has been found that the particular photoinitiator is not important; any of the known photoinitiators may be used. A different thixotrope may also be used, but when fumed silica is used, amounts greater than about 4 wt% make the mixture too thick. For roll-coating or dipping, much less than 4 wt% will be used, or the thixotropic agent may be dispensed with entirely. Therefore, the amount of thixotrope will be 0 to 4 wt% of the composition.

Other components that have been coated with the composition of the present invention include tantalum pellet, metallized polypropylene capacitors and tubular ceramics. These coatings confer humidity resistance and also resistance to salt water spray, thermal shock, temperature cycling, and alkaline reagents.

If pure triacrylate or tetraacrylate become cost-competitive with the triacrylate-tetraacrylate blend, either may be substituted for the blend.

What is claimed is:

1. An electronic component coated with an ultraviolet light cured coating comprising a urethane, a triacrylate-tetraacrylate blend, a photoinitiator, and a wet adhesion monomer chosen from the group of allylic and acrylic ureides, said coating providing resistance to humidity and to salt water.

2. A component according to claim 1 wherein a thixotropic agent is present.

3. A component according to claim 2 wherein 0 to 4 wt% thixotrope is used.

4. A component according to claim 1 wherein said urethane is an aliphatic acrylic urethane, and at least one acrylate chosen from the group of mono-acrylates and diacrylates is present in addition to the triacrylate-tetraacrylate blend.

5. A component according to claim 4 wherein a monoacrylate and a triacrylate-tetraacrylate blend are used.

6. A component according to claim 5 wherein said urethane is an aliphatic acrylic urethane, said monoacrylate is ethoxyethoxyethyl monoacrylate, and said triacrylate-tetraacrylate blend is pentaerythritol triacrylate-tetraacrylate blend.

7. A component according to claim 6 wherein the amount of said urethane is 50 to 70 wt%, the amount of said monoacrylate is 0 to 33 wt%, the amount of said triacrylate-tetraacrylate blend is 5 to 8 wt%, the amount of said photoinitiator is about 1 wt% and the amount of said wet adhesion monomer is about 1 wt%.

8. A component according to claim 4 wherein a diacrylate and a triacrylate-tetraacrylate blend are used.

9. A component according to claim 8 wherein said urethane is an aliphatic acrylic urethane, said diacrylate is tetraethyleneglycol diacrylate, and said triacrylate-tetraacrylate blend is pentaerythritol triacrylate-tetraacrylate blend.

10. A component according to claim 9 wherein the amount of said urethane is 50 to 70 wt%, of said diacrylate is 5 to 40 wt%, of said triacrylate-tetraacrylate blend is 5 to 40 wt%, of said wet adhesion monomer is 0.5 to 3 wt%, and of said photoinitiator is 0.5 to 1 wt%.

11. A component according to claim 10 wherein the amount of said urethane is 70 wt%, of said diacrylate is 16.5 wt%, of said triacrylate-tetraacrylate blend is 10 wt%, of said wet adhesion monomer is 0.5 wt%, and of said photoinitiator is 1 wt%.

12. A component according to claim 10 wherein the amount of said urethane is 60 wt%, of said diacrylate is 6.5 wt%, of said triacrylate-tetraacrylate blend is 30 wt%, of said wet adhesion monomer is 0.5 wt%, and of said photoinitiator is 1 wt%.

* * * * *